United States Patent [19]

Ibrahim et al.

[11] 4,099,197
[45] Jul. 4, 1978

[54] COMPLEMENTARY INPUT STRUCTURE FOR CHARGE COUPLED DEVICE

[75] Inventors: Abd-El-Fattah Ali Ibrahim; Carl Neil Berglund, both of Ottawa, Canada

[73] Assignee: Northern Telecom Limited, Montreal, Canada

[21] Appl. No.: 713,661

[22] Filed: Aug. 12, 1976

[51] Int. Cl.² .................. H01L 29/78; G11C 19/28; H03H 7/28
[52] U.S. Cl. .................. 357/24; 307/221 D; 333/70 T
[58] Field of Search .................. 357/24; 307/221 D; 333/70 T

[56] References Cited

U.S. PATENT DOCUMENTS

| | | | |
|---|---|---|---|
| 3,623,132 | 11/1971 | Green | 357/24 |
| 3,876,952 | 4/1975 | Weimer | 357/24 |
| 3,877,056 | 4/1975 | Bailey | 357/24 |
| 3,897,282 | 7/1975 | White | 357/24 |
| 3,937,985 | 2/1976 | Cooper | 357/24 |
| 3,969,634 | 7/1976 | Su et al. | 357/24 |
| 4,005,377 | 1/1977 | Engeler | 357/24 |

OTHER PUBLICATIONS

Ibrahim et al., "Multiple Filter Characteristics Using a Single CCD Structure", Int. Conf. Application of CCD's, San Diego (10/75), Proc., pp. 245-249.

*Primary Examiner*—William D. Larkins
*Assistant Examiner*—Gene M. Munson
*Attorney, Agent, or Firm*—John E. Mowle

[57] ABSTRACT

An input structure for a charge coupled device (CCD) which develops a charge proportional to a signal in one channel, and the complement of that charge in a second channel. The dual channel CCD can be used in transversal filter applications without the need for a differential amplifier at its output.

3 Claims, 3 Drawing Figures

4,099,197

COMPLEMENTARY INPUT STRUCTURE FOR CHARGE COUPLED DEVICE

This invention relates to an input structure which provides complementary signals in two channels of a charge coupled device and more particularly to one which may be used to implement transversal filtering in such a device without the need for an associated operational amplifier.

BACKGROUND OF THE INVENTION

In an article entitled: "Charge-Coupled Devices — A New Approach to MIS Device Structure", IEEE Spectrum, July 1971, pp 18–27, W. S. Boyle and G. E. Smith describe a new information-handling structure, the charge-coupled device, (CCD). The device stores a minority-carrier charge in potential wells created at the surface of a semiconductor and transports the charge along the surface by the application of bias potentials to control electrodes so as to move the potential wells.

Numerous applications have been proposed for the CCD. It can be utilized as a transversal filter, such as described in an article by A. Ibrahim et al entitled: "Multiple Filter Characteristics Using a Single CCD Structure", International Conference on the Application of Charge-Coupled Devices, October, pp 245–249; or as a recursive filter, such as described in an article by D. A. Sealer and M. F. Tompsett entitled: "A Dual Differential Analog CCD For Time-Shared Recursive Filters", ISSCC February 1975, pp 152–153. One disadvantage of prior structures of this type is that in order to provide both positive and negative coefficients of the sampled signals, it is necessary to subtract two charge signals at each delay stage. This is generally achieved utilizing a differential amplifier. However, the success of this approach requires the integration of a MOST (metal-oxide-silicon-transistor) operational amplifier on the same chip as the CCD, to reduce the final cost.

STATEMENT OF THE INVENTION

The present invention provides a unique input structure for providing complementary charges in two CCD channels which permits weighting and direct summing of the detected signals thereby negating the requirement for a differential amplifier.

Thus, in accordance with the present invention there is provided a complementary input structure for a multi-channel charge coupled device comprising: a charge storage body, a dielectric layer disposed over the body and a pair of channels each having a plurality of electrodes disposed over the dielectric layer for controlling the sequential transfer of mobile charges along the body in response to clock voltages applied thereto. The input structure comprises a common input electrode disposed over the dielectric layer adjacent the head of each channel for controlling a charge of fixed magnitude in the body from an adjacent source. In addition, the input structure includes a control electrode at the head of each channel in juxtaposition with the common input electrode and individually responsive to separate control signals for transferring a selected portion of the fixed magnitude charge to one channel and the balance to the other channel, whereby the charge in the other channel is the complement of that in said one channel.

In a particular embodiment, selected ones of the electrodes in each of the two channels are divided along the length of the channel to divide the charges being transferred therebeneath in preselected ratios. One portion of each of the divided electrodes from both channels are connected in common, whereby the total charge beneath the common portions of the divided electrodes is a function of the individual magnitude of the charges being transferred along the two channels and the relative division of each of the electrodes in the two channels.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
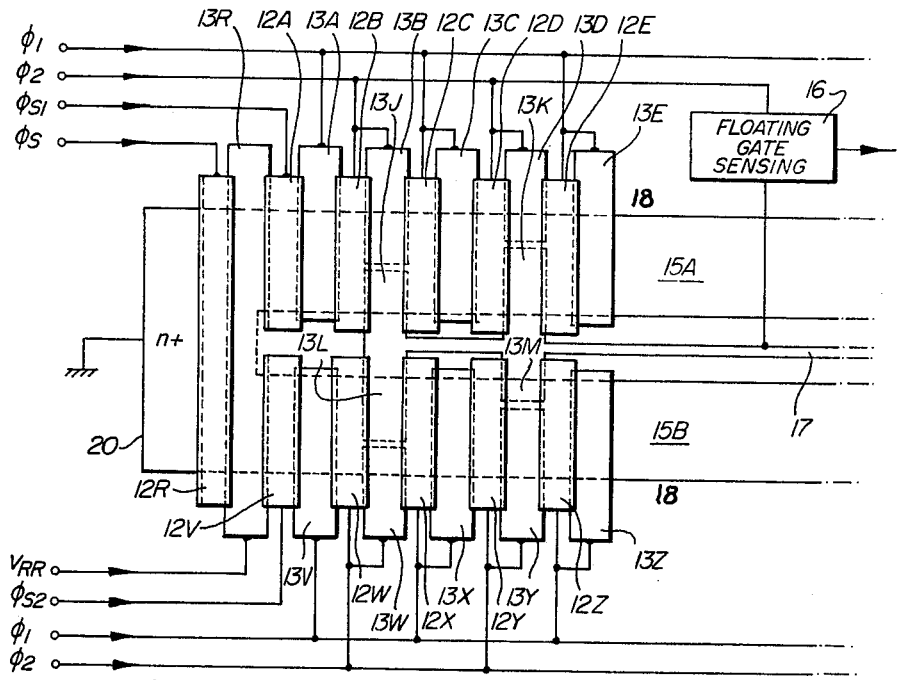
FIG. 1 is a pictorial plan view of a dual channel charge coupled device including an input structure in accordance with the present invention.

The fabrication of the charge coupled device described herein utilizes technologies well established and known in the semiconductor field. It is therefore considered unnecessary to describe in detail the individual steps for forming the device. However, U.S. Pat. No. 3,897,282 issued July 29, 1975 to James J. White describes one method of constructing a two-level poly-silicon charge coupled device which is the basic structure of the device disclosed herein. Also, it is evident that the figures shown in the drawings are exemplary of the construction of the invention and not necessarily drawn to scale.

In the following detailed description and accompanying drawings basic reference numerals are assigned to individual elements of the device. Where it is necessary to distinguish between repetitive elements in a row additional reference characters are added to the base number. In general, reference is made only to the base number.

Figure 2:
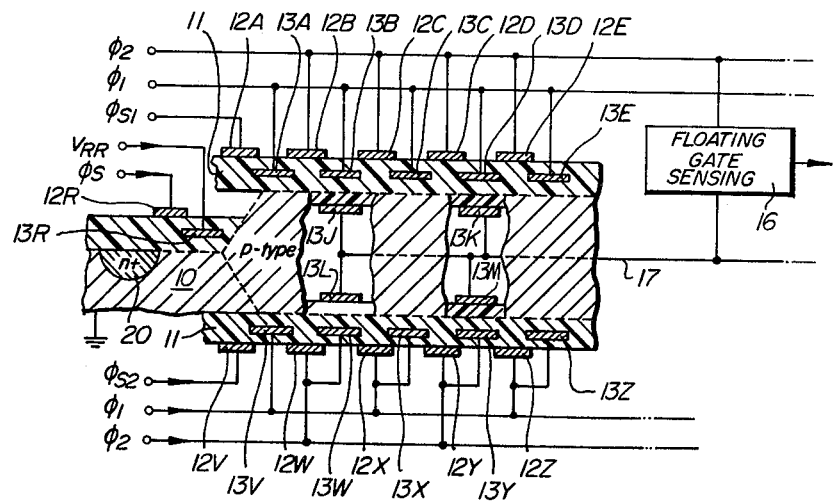
FIG. 2 is a pictorial diagram of a side elevational view of the structure illustrated in FIG. 1.

Referring to FIGS. 1 and 2, the two-phase charge coupled device comprises a charge storage body 10 of p-type silicon having a variable thickness silicon dioxide ($SiO_2$) insulating layer 11 deposited thereon. A row of alternately upper 12 and lower 13 elongated poly-silicon electrodes laterally disposed so as to overlap adjacent ones thereto, have been deposited on the insulating layer 11. As will be manifest hereinafter, the lower electrodes 13 function as storage control electrodes while the upper electrodes 12 function as transfer gates in a well known manner.

As illustrated in FIG. 1, the silicon dioxide insulating layer 11 includes gate oxide regions 15 beneath which the packets of charge are transferred in n-channels along the row under control of clock voltages applied to the field plates 12 and 13. These gate oxide regions 15 consist of alternating thicknesses of insulating layer 11 which is approximately 1100 Å thick under the storage electrodes 13 and 3000 Å thick under the transfer electrodes 12. The surrounding thicker portions are designated as field oxide regions 18. These latter regions 18 are sufficiently thick (approximately 1.2 $\mu m$) that the portions of the semiconductor substrate 10 immediately beneath them do not invert in response to the application of clock voltages to the electrodes 12 and 13. Consequently, the minority-carrier charges are only carried along the substrate 10 immediately adjacent the gate oxide regions 15.

At the head of the channels 15 is a diffused n+ source of mobile charges or carriers 20. This is followed by a transfer gate 12R and an initial storage electrode 13R which is common to both channels 15. Immediately adjacent the common storage electrode 13R in each channel 15A and 15B is a control electrode 12A and 12V respectively. Unlike the balance of the electrodes in the channels 15, these electrodes 12R, 13R, 12A and 12V are controlled by separate clocks as will be described hereinafter.

In addition, it can be seen that every second storage electrode 13 is divided along the length of the channel 15 with the inward facing portions of the divided electrodes 13J, 13K, 13L and 13M being connected in common. These divided electrodes provide the weighting factor during the nondestructive sensing of the magnitude of the analog charges being transferred along the channels 15.

Figure 3:
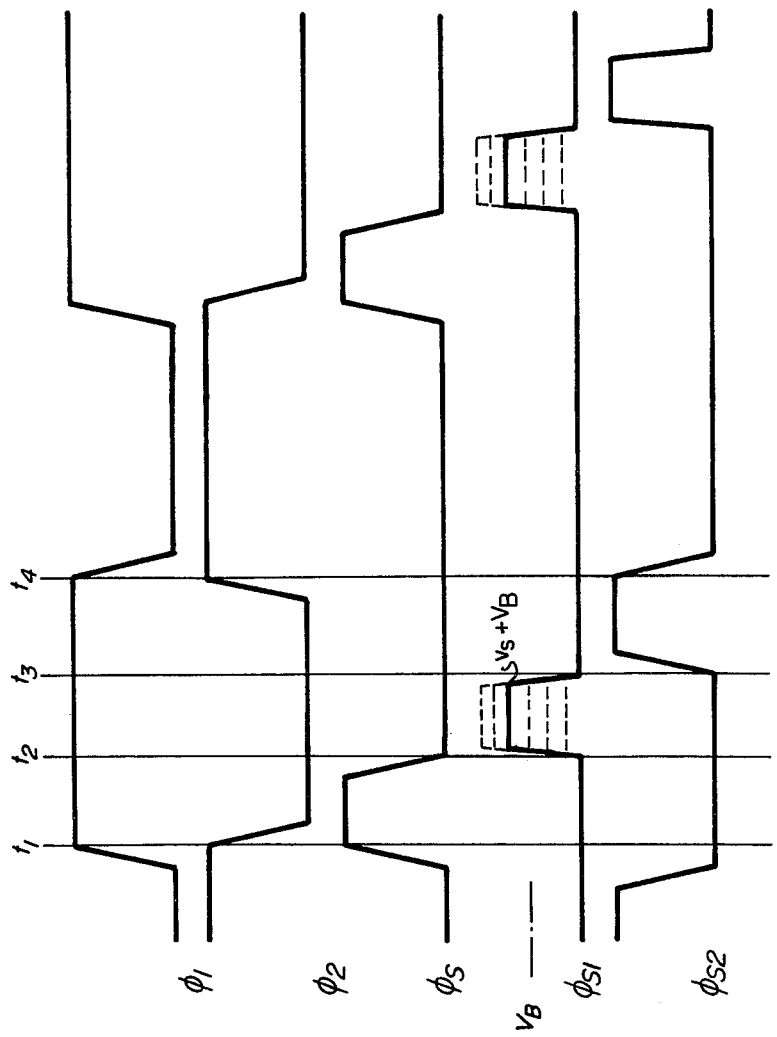
FIG. 3 illustrates typical waveforms of the various clock voltages which are applied to the device illustrated in FIGS. 1 and 2.

In FIGS. 1 and 2, the clock drives are identified by reference characters $\theta_1$, $\theta_2$, $\theta_s$, $\theta_{s1}$ and $\theta_{s2}$ having voltage waveforms identified by corresponding reference characters in FIG. 3. Referring now to all three figures, at time $t_1$, the clock drives $\theta_1$ and $\theta_s$ go high and a mobile charge of electrons is transferred from the source 20 to beneath the storage electrode 13R which has a fixed reference voltage $V_{RR}$ applied thereto. This reference voltage $V_{RR}$ is selected to provide a charge $Q_{RR}$ under electrode 13R of a preselected magnitude which acts as a virtual source of charge for the two channels 15A and 15B. At time $t_2$, $\theta_s$ goes low and $\theta_{s1}$ goes high. This signal $\theta_{s1}$ is the composite of a d-c bias voltage $V_B$ and an a-c signal $v_s$ such as from a transmission line (not shown). Since electrode 13A has already been driven high by clock $\theta_1$ at time $t_1$, the signal under control of clock $\theta_{s1}$ transfers a preselected portion of the charge $Q_{RS}$ to beneath the storage electrode 13A.

At time $t_3$, $\theta_{s1}$ goes low and $\theta_{s2}$ goes high. This applies sufficient voltage to transfer gate 12V to transfer the balance of the charge beneath the electrode 13R to beneath the storage electrode 13V which has also been driven high. Thus, the charge stored beneath the electrode 13V, $Q_{RR}-Q_{RS}$ is the complement of the charge stored beneath the electrode 13A. At time $t_4$, clock $\theta_2$ goes high, followed by clock $\theta_1$ going low which transfers or dumps the charge beneath the electrodes 13A and 13V to beneath the divided or split electrodes 13B, 13J, 13L and 13W in a well known manner.

Since the magnitude of the voltage applied to each half of the divided electrodes is the same, the charge will split between the two in accordance with the relative length of each electrode.

The relative magnitude of the total charge beneath the electrodes 13J, 13L, 13K and 13M can be monitored by a floating gate sensing network 16 using a nondestructive sensing technique such as described in the above-mentioned paper by A. Ibrahim et al.

In a typical application of a CCD transversal filter an a-c signal $v_s$ superimposed on a d-c bias voltage $V_B$ is applied via clock $\theta_{s1}$ to gate electrode 12A, to transfer a preselected portion $Q_{RS}$ of the charge $Q_{RR}$ previously stored beneath storage electrode 13R to beneath electrode 13A. The complement or balance of this charge $Q_{RR}-Q_{RS}$ is then transferred beneath storage electrode 13V under control of clock $\theta_{s2}$. The charges are then concurrently transferred along the channels 15A and 15B under control of clocks $\theta_1$ and $\theta_2$. At each of the split electrodes 13 the weighting factors are determined by the relative lengths. By repeatedly nondestructively sampling the weighted charge under the various split storage electrodes 13 and summing their outputs in the network 16, an output signal from the electrode 17 can be obtained which is proportional to the magnitude of the charges being transferred along both channels 15A and 15B and the relative weighting determined by the division of the split electrodes. Because the complement of the charge being transferred along channel 15A is transferred along channel 15B, the sensed signals can be summed directly without the necessity of providing a differential amplifier. This technique results in a d-c offset on the sensed signal on electrode 17 which can be readily removed in the output network 16.

While the floating gate sensing network utilizes semiconductor amplifiers, these can be readily constructed utilizing MOS (metal-oxide-silicon) technology, the same as that used to construct the CCD. Also it will be understood that the entire structure could be implemented utilizing p-channel technology on a n-type silicon substrate.

What is claimed is:
1. A charge coupled device comprising:
   a charge storage body;
   a dielectric layer disposed over the body;
   a pair of channels each having a plurality of electrodes disposed over the dielectric layer for controlling the sequential transfer of mobile charges along the length of each channel in said body in response to clock voltages applied thereto;
   a common input electrode adjacent the head of each channel for controlling a charge of fixed magnitude in said body from an adjacent source;
   each channel having a control electrode in juxtaposition with the common input electrode, and individually responsive to separate control signals for transferring a selected portion of said fixed magnitude charge to one channel and the balance of the charge to the other channel;
   at least one electrode in each channel being preselectively divided into two disconnected portions by a gap along the length of the channel, to divide the charges being transferred therebeneath in preselected ratios, one portion of each of the divided electrodes in each of the pair of channels being connected in common;
   whereby the total charge beneath the common portions of the divided electrodes is a function of the individual magnitude of the charges being transferred along the two channels and the relative division of each of the electrodes in the two channels.

2. A charge coupled device as defined in claim 1 additionally including an input control circuit comprising:
   means for initially applying a reference voltage of fixed magnitude to said common input electrode to obtain a charge of fixed magnitude therebeneath from said adjacent source;
   thence, means for applying a signal of varying magnitude to the control electrode in one channel to transfer a selected portion of said fixed magnitude charge therebeneath;
   thence, means for applying a voltage of fixed magnitude to the control electrode in the other channel to transfer the balance of the fixed magnitude charge therebeneath.

3. A charge coupled device as defined in claim 1 which additionally includes a control circuit comprising:

means for generating a floating charge on the common portions of the divided electrodes; and means for monitoring the voltage change in the charge on the common portions of the divided electrodes when said mobile charges are transferred therebeneath.

* * * * *